United States Patent
Schulze et al.

(10) Patent No.: US 9,859,272 B2
(45) Date of Patent: Jan. 2, 2018

(54) SEMICONDUCTOR DEVICE WITH A REDUCED BAND GAP ZONE

(71) Applicant: Infineon Technologies AG, Neubiberg (DE)

(72) Inventors: Hans-Joachim Schulze, Taufkirchen (DE); Holger Huesken, Munich (DE); Franz-Josef Niedernostheide, Hagen a. T.W. (DE); Frank Dieter Pfirsch, Munich (DE); Roman Roth, Sattendorf (AT); Christian Philipp Sandow, Haar (DE); Carsten Schaeffer, Annenheim (AT); Stephan Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/210,449

(22) Filed: Jul. 14, 2016

(65) Prior Publication Data

US 2017/0025408 A1    Jan. 26, 2017

(30) Foreign Application Priority Data

Jul. 20, 2015  (DE) ...................... 10 2015 213 630

(51) Int. Cl.
*H01L 29/66* (2006.01)
*H01L 27/06* (2006.01)
(Continued)

(52) U.S. Cl.
CPC ...... *H01L 27/0664* (2013.01); *H01L 29/0619* (2013.01); *H01L 29/0834* (2013.01);
(Continued)

(58) Field of Classification Search
CPC ............ H01L 27/0664; H01L 29/0619; H01L 29/1095; H01L 29/165; H01L 29/47; H01L 29/45; H01L 29/7397
See application file for complete search history.

(56) References Cited

U.S. PATENT DOCUMENTS

2011/0215377 A1   9/2011  Pan
2014/0077230 A1   3/2014  Horng

FOREIGN PATENT DOCUMENTS

DE   11 2005 002 418 T5    9/2007

OTHER PUBLICATIONS

Office Action communication of the German Patent and Trademark Office for Appln. Serial No. 102015213630.2, dated May 10, 2016.

*Primary Examiner* — Elias M Ullah
(74) *Attorney, Agent, or Firm* — Baker Botts L.L.P.

(57) ABSTRACT

A semiconductor device comprising a source region being electrically connected to a first load terminal (E) of the semiconductor device and a drift region comprising a first semiconductor material (M1) having a first band gap, the drift region having dopants of a first conductivity type and being configured to carry at least a part of a load current between the first load terminal (E) and a second load terminal (C) of the semiconductor device, is presented. The semiconductor device further comprises a semiconductor body region having dopants of a second conductivity type complementary to the first conductivity type and being electrically connected to the first load terminal (E), a transition between the semiconductor body region and the drift region forming a pn-junction, wherein the pn-junction is configured to block a voltage applied between the first load terminal (E) and the second load terminal (C). The semiconductor body region isolates the source region from the drift region and includes a reduced band gap zone comprising a second semiconductor material (M2) having a second (Continued)

band gap that is smaller than the first band gap, wherein the reduced band gap zone is arranged in the semiconductor body region such that the reduced band gap zone and the source region exhibit, in a cross-section along a vertical direction (Z), at least one of a common lateral extension range (LR) along a first lateral direction (X) and a common vertical extension range (VR) along the vertical direction (Z).

20 Claims, 15 Drawing Sheets

(51) Int. Cl.
*H01L 29/739* (2006.01)
*H01L 29/10* (2006.01)
*H01L 29/45* (2006.01)
*H01L 29/47* (2006.01)
*H01L 29/06* (2006.01)
*H01L 29/08* (2006.01)
*H01L 29/165* (2006.01)

(52) U.S. Cl.
CPC ........ *H01L 29/1095* (2013.01); *H01L 29/165* (2013.01); *H01L 29/45* (2013.01); *H01L 29/47* (2013.01); *H01L 29/7397* (2013.01)

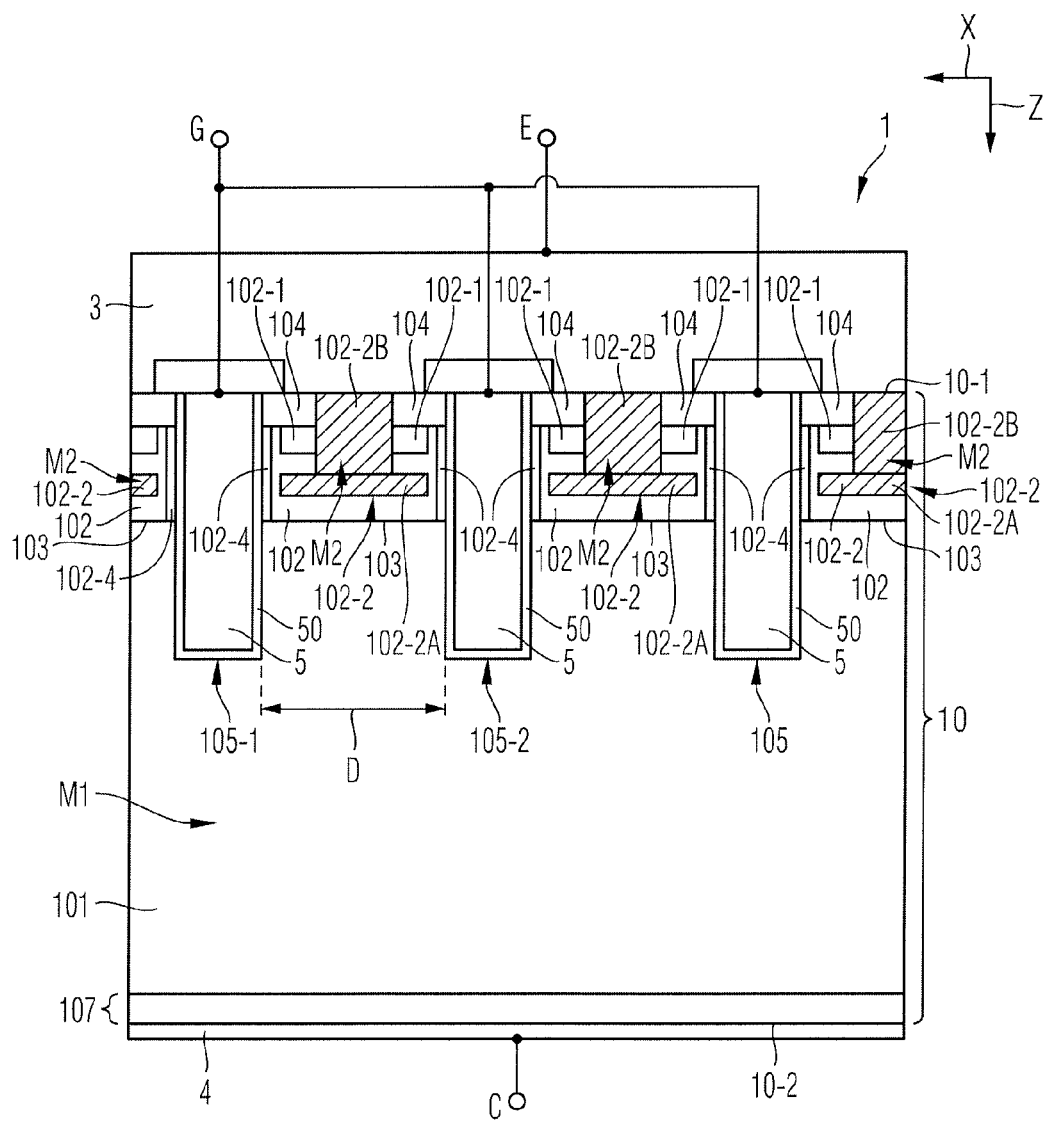

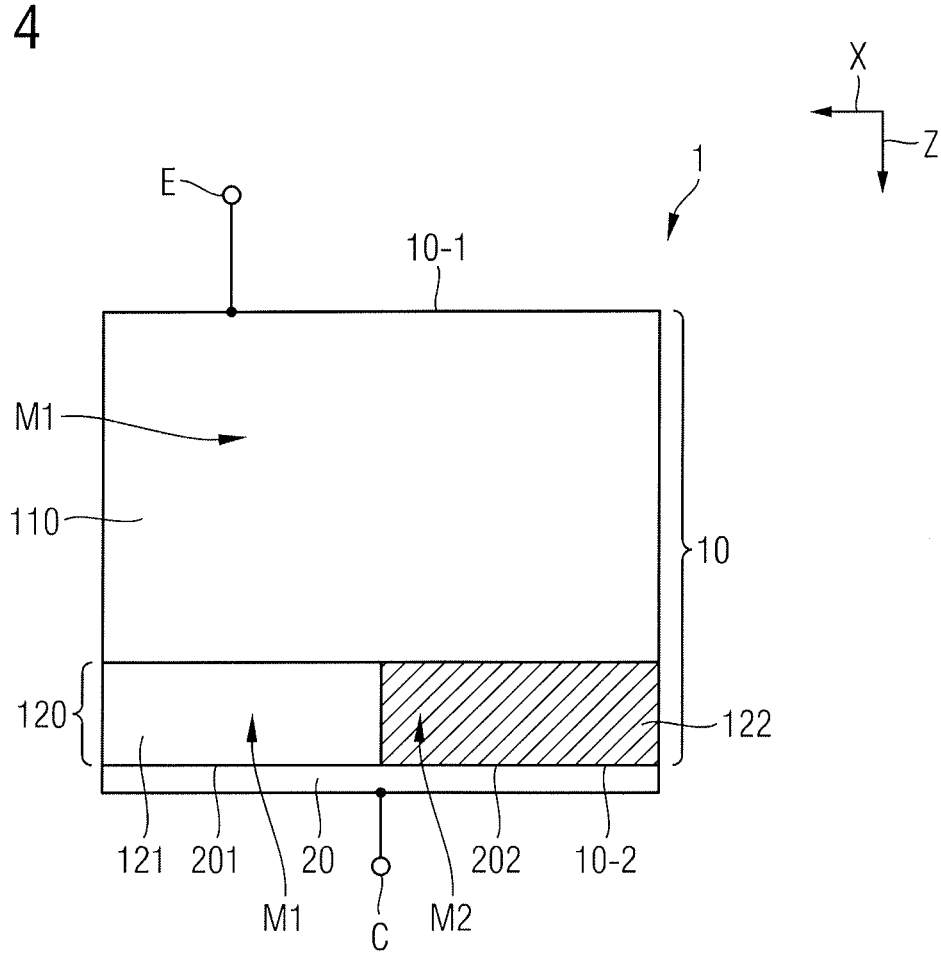

SEMICONDUCTOR DEVICE WITH A REDUCED BAND GAP ZONE

CROSS-REFERENCE TO RELATED APPLICATION

This application claims priority to German Application Serial No. 102015213630.2 filed Jul. 20, 2015 and entitled "Semiconductor Device with a Reduced Band Gap Zone".

TECHNICAL FIELD

This specification refers to embodiments of a semiconductor device and of a semiconductor device processing method. In particular, this specification refers to embodiments of a semiconductor device exhibiting a reduced band gap zone inside a semiconductor body region, a source zone comprising a reduced band gap material, or an emitter zone comprising a reduced band gap material.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

In designing such semiconductor devices, several aspects need to be considered at a time. For example, it is generally desirable to find an optimal balance between a small channel resistance, a small short circuit current, certain targeted injection properties, and a current switch-off capability of an IGBT. Conventionally, this optimization problem is addressed by creating a superposition of several different doping profiles corresponding to, for example, a source region, and anti-latch up zone, and a body region within a MOS control head of a power transistor, such as an IGBT. However, due to interactions between the different doping profiles, it is generally not possible to optimize one profile with respect to properties of the corresponding semiconductor region without affecting adversely the properties of another semiconductor region. For example, an increased dopant level of said source region may yield an undesired increase of an anti-latch up resistance due to interference of the corresponding doping profiles.

SUMMARY

According to an embodiment, a semiconductor device is presented. The semiconductor device comprises a source region being electrically connected to a first load terminal of the semiconductor device and a drift region comprising a first semiconductor material having a first band gap, the drift region having dopants of a first conductivity type and being configured to carry at least a part of a load current between the first load terminal and a second load terminal of the semiconductor device. The semiconductor device further comprises a semiconductor body region having dopants of a second conductivity type complementary to the first conductivity type and being electrically connected to the first load terminal, a transition between the semiconductor body region and the drift region forming a pn-junction, wherein the pn-junction is configured to block a voltage applied between the first load terminal and the second load terminal. The semiconductor body region isolates the source region from the drift region and includes a reduced band gap zone comprising a second semiconductor material having a second band gap that is smaller than the first band gap, wherein the reduced band gap zone and the source region exhibit, in a cross-section along a vertical direction, at least one of a common lateral extension range along a first lateral direction and a common vertical extension range along the vertical direction. The first load terminal comprises a contact metal arranged in contact with each of the source region and the reduced band gap zone. The semiconductor body region further comprises an anti latch-up zone, the anti latch-up zone being arranged in contact with the source region and the contact metal, and exhibiting a higher electric conductivity than the semiconductor body region external of the anti latch-up zone, wherein the anti latch-up zone and the reduced band gap zone exhibit a common overlap region.

According to a further embodiment, a semiconductor device comprises a source region being electrically connected to a first load terminal of the semiconductor device and a drift region comprising a first semiconductor material having a first band gap, the drift region having dopants of a first conductivity type and being configured to carry at least a part of a load current between the first load terminal and a second load terminal of the semiconductor device. The semiconductor device further comprises a semiconductor body region having dopants of a second conductivity type complementary to the first conductivity type and being electrically connected to the first load terminal, a transition between the semiconductor body region and the drift region forming a pn-junction, wherein the pn-junction is configured to block a voltage applied between the first load terminal and the second load terminal. The semiconductor body region isolates the source region from the drift region and includes a reduced band gap zone comprising a second semiconductor material having a second band gap that is smaller than the first band gap, wherein the reduced band gap zone and the source region exhibit, in a cross-section along a vertical direction, at least one of a common lateral extension range along a first lateral direction and a common vertical extension range along the vertical direction. The semiconductor device further comprises a first gate trench and a second gate trench extending into the semiconductor body along the vertical direction, the semiconductor body region being arranged between the first gate trench and the second gate trench, wherein the reduced band gap zone extends for at least 20% of a horizontal distance between the first gate trench and the second gate trench along the first lateral direction.

According to a yet further embodiment, a further semiconductor device is presented. The further semiconductor device comprises a semiconductor body coupled to a first load terminal and a second load terminal of the semiconductor device, wherein the semiconductor body includes: a first semiconductor layer comprising a first semiconductor material having a first band gap, the first semiconductor layer being configured to carry at least a part of a load current between the first load terminal and the second load terminal; and an emitter layer being in contact with the first semiconductor layer and being configured to inject charge carriers into the first semiconductor layer, wherein the emitter layer includes at least one first emitter zone comprising the first semiconductor material and at least one second emitter zone arranged laterally adjacent to the first emitter zone and comprising a second semiconductor material having a second band gap that is smaller than the first band gap. The semiconductor device further comprises a metal layer being electrically connected with one of the first load terminal and the second load terminal and arranged in contact with the emitter layer, a transition between the metal layer and the first emitter zone forming a first semiconductor-to-metal transition exhibiting a first contact resistance, and a transition between the metal layer and the second emitter zone forming a second semiconductor-to-metal transition exhibiting a second contact resistance that is smaller than the first contact resistance According to another embodiment, a method of processing a semiconductor device is provided. The method includes providing a semiconductor body and forming a drift region in the semiconductor body, the drift region comprising a first semiconductor material having a first band gap and having dopants of a first conductivity type; and creating, in the semiconductor body, a semiconductor body region having dopants of a second conductivity type and a source region having dopants of the first conductivity type on top of the drift region such that the semiconductor body region isolates the source region from the drift region. Creating the semiconductor body region includes creating, in the semiconductor body region, a reduced band gap zone comprising a second semiconductor material having a second band gap that is smaller than the first band gap; and arranging the reduced band gap zone within the semiconductor body zone such that the reduced band gap zone and the source region exhibit, in a cross-section along a vertical direction, at least one of a common lateral extension range along a first lateral direction and a common vertical extension range along the vertical direction.

According to another embodiment, a further method of processing a semiconductor device is provided. The further method comprises: providing a semiconductor body and forming, in the semiconductor body, a drift region comprising a first semiconductor material having a first band gap and having dopants of a first conductivity type; and creating, in the semiconductor body, a semiconductor body region having dopants of a second conductivity type and a source region having dopants of the first conductivity type on top of the drift region such that the semiconductor body region isolates the source region from the drift region. Creating the source region includes creating, within the source region, at least one first source zone comprising the first semiconductor material; and forming at least one second source zone adjacent to the first source zone, wherein the second source zone comprises a second semiconductor material having a second band gap that is smaller than the first band gap.

According to yet a further embodiment, a further method of processing a semiconductor device is provided. The method comprises providing a semiconductor body and forming, in the semiconductor body, a first semiconductor layer comprising a first semiconductor material having a first band gap and an emitter layer on top of the first semiconductor layer such that the emitter layer is configured to inject charge carriers into the first semiconductor layer. Creating the emitter layer includes creating, within the emitter layer, at least one first emitter zone comprising the first semiconductor material; and arranging at least one second emitter zone laterally adjacent to the first emitter zone, wherein the at least one second emitter zone comprises a second semiconductor material having a second band gap that is smaller than the first band gap.

Those skilled in the art will recognize additional features and advantages upon reading the following detailed description, and upon viewing the accompanying drawings.

BRIEF DESCRIPTION OF THE DRAWINGS

The parts in the Figures are not necessarily to scale, instead emphasis being placed upon illustrating principles of the invention. Moreover, in the Figures, like reference numerals designate corresponding parts. In the drawings:

FIG. 2E schematically illustrates a section of a vertical cross-section of a semiconductor device having a body region according to one or more embodiments;

FIG. 4 schematically illustrates a section of a vertical cross-section of a semiconductor device having an emitter layer according to one or more embodiments;

DETAILED DESCRIPTION

Figure 1:
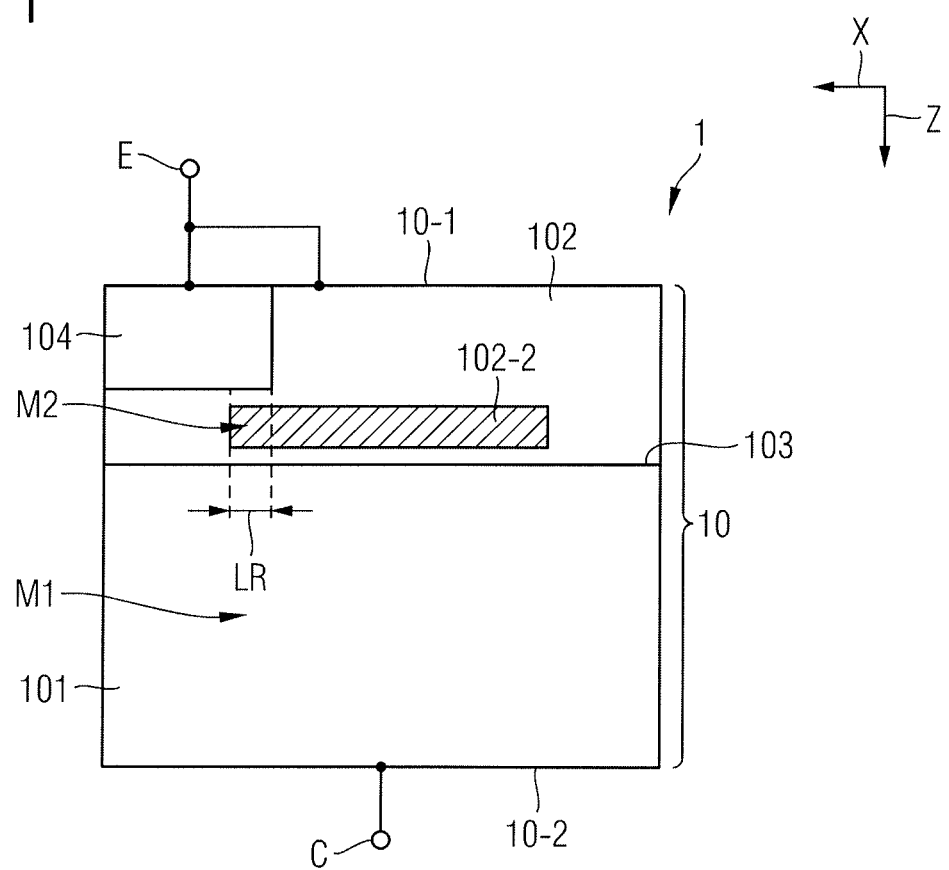
FIG. 1 schematically illustrates a section of a vertical cross-section of a semiconductor device having a body region according to one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the Figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, direction Z mentioned below may be a vertical direction Z that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped. Further, within this specification, the term "dopant concentration" may refer to an integral dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device, e.g., monolithically integrated diode or transistor cells, such as monolithically integrated IGBT cells, monolithically integrated reverse conducting IGBT cells, monolithically integrated MOS Gated Diode (MGD) cells, or monolithically integrated MOSFET cells and/or derivatives thereof that may be used within a power converter or a power supply.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 5 V, more typically 15 V and above.

FIG. 1 schematically illustrates a section of a vertical cross-section of a semiconductor device 1 according to one or more embodiments. The semiconductor device 1 comprises a semiconductor body 10 coupled to a first load terminal E and a second load terminal C. For example, the semiconductor device 1 is configured to conduct a load current between the first load terminal E and the second load terminal C.

In the exemplary embodiment of FIG. 1, the first load terminal E is arranged at a front side 10-1 of the semiconductor body 10, whereas the second load terminal C is arranged at a back side 10-2 of the semiconductor body 10. In other words, in the embodiment illustrated in FIG. 1, the semiconductor device 1 exhibits a vertical set up, implying that the semiconductor body 10 is arranged in between the first load terminal E and the second load terminal C and that the load current may flow between the first load terminal E and the second load terminal C along a vertical direction Z. It shall be understood, however, that the second load terminal C could also be arranged on the front side 10-1 in accordance with another embodiment.

For conducting the load current between the first load terminal E and the second load terminal C, the semiconductor device 1 comprises a drift region 101 comprising the first semiconductor material M1 having a first band gap. The drift region 101 has dopants of the first conductivity type and is configured to carry at least a part of the load current between the first load terminal E and the second load terminal C of the semiconductor device 1. For example, the drift region 101 may comprise n-doped silicon as the first semiconductor material M1.

For establishing an electrical connection between the first load terminal E and the semiconductor body 10, a source region 104 being electrically connected to the first load terminal E may be provided. The source region 104 may be a semiconductor source region and may form a part of the semiconductor body 10 and may, for example, have dopants of the first conductivity type. Alternatively, the source region 104 may, for instance, comprise a metal (so-called "metal source").

The semiconductor body 10 further comprises a semiconductor body region (in the following referred to as body region) 102, which isolates the source region 104 from the drift region 101. The body region 102 has dopants of a second conductivity type complementary to the first conductivity type and is electrically connected to the first load terminal E. A transition between the body region 102 and the drift region 101 forms a pn-junction 103, wherein the pn-junction 103 is configured to block a voltage applied between the first load terminal E and the second load terminal C.

The body region 102 comprises a reduced band gap zone 102-2 (see hatched area in FIG. 1) comprising a second semiconductor material M2 having a second band gap that is smaller than the first band gap. The second band gap may be smaller than the first band gap by at least 0.1 eV. For example, silicon (Si) may be used as the first semiconductor material M1 and silicon germanium (SiGe) may be used as the second semiconductor material M2. In other embodiments, gallium arsenide may be used as the first semiconductor material M1 and germanium may be used as the second semiconductor material M2.

In the embodiment illustrated in FIG. 1, the reduced band gap zone 102-2 is arranged inside the semiconductor body region 102 such that the reduced band gap zone 102-2 and the source region 104 exhibit, in the depicted cross-sectional view along the vertical direction Z, a common lateral extension range LR along a first lateral direction X.

In other embodiments, as will be explained below with reference to FIG. 2F, the reduced band gap zone 102-2 may be arranged in the semiconductor body region 102 such that the reduced band gap zone 102-2 and the source region 104 exhibit, in a vertical cross-section, a common vertical extension range VR along the vertical direction Z.

The respective common lateral or vertical extension range LR, VR may exhibit a width of at least 100 nm, at least 300 nm, or even more than 1 μm. For example, a silicon germanium zone 102-2 may be arranged as a reduced band gap zone 102-2 inside a silicon body region 102 of a vertical power semiconductor device 1 such that the silicon germanium zone 102-2 exhibits a sizable common lateral extension range LR with the source region 104 along a first lateral direction X, wherein the first lateral direction X extends in parallel to a horizontal surface of the front side 10-1 of the semiconductor device 1.

FIGS. 2A to 2F schematically illustrate some further embodiments of such a semiconductor device 1, wherein the reduced band gap zone 102-2 can be arranged, e.g., in different locations within a MOS control head of the semiconductor device 1. For example, the semiconductor devices 1 illustrated in FIGS. 2A to 2F may each form at least one transistor cell of an IGBT, a reverse conducting IGBT, or a MOSFET, wherein said MOS control head may be formed, e.g., by at least the source region 104, the body region 102 and the drift region 101.

The semiconductor devices 1 depicted in FIGS. 2A to 2E may each be employed for realizing a transistor cell of, for example, a vertical trench IGBT, a reverse conducting vertical trench IGBT, or a vertical trench MOSFET. Each semiconductor device 1 comprises a plurality of gate trenches 105, 105-1, 105-2 extending into the semiconductor body 10 along the vertical direction Z. Within each transistor cell, the body region 102 is arranged between a first gate trench 105-1 and a second gate trench 105-2, each of the gate trenches 105, 105-1, 105-2 being arranged in contact with the body region 102, a source region 104 of the transistor cell, and the drift region 101. The gate trenches 105, 105-1, 105-2 each comprise a gate electrode 5, which is electrically insulated from the source region 104, the body region 102, and the drift region 101 by a respective insulator 50.

For switching the semiconductor device 1 between a conducting state, during which the load current can be conducted between the first load contact E and the second load contact C, and a blocking state, in which the pn-junction 103 blocks a voltage applied between the first load terminal E and the second load terminal C, a gate terminal G is provided. The gate terminal G may be configured to receive a control signal from external of the semiconductor device 1. For example, the signal received by the gate terminal G from external of the semiconductor device 1 may be a voltage signal. Further, the gate terminal G may be electrically connected to the gate electrodes 5 include in the gate trenches 105, 105-1 and 105-2.

The gate electrode 5 may be configured to induce an inversion channel inside a channel region 102-4 of the semiconductor body region 102 in dependence of the voltage signal received from external of the semiconductor device 1 via the gate terminal G, wherein the channel region 102-4 may extend along the insulator 50 through the body region 102 from the source region 1042 to the drift region 101. When the channel region 102-4 is present, the semiconductor device 1 may be in its conducting state.

For establishing an electrical connection with the semiconductor body 10, the first load terminal E may comprise a contact metal 3 arranged in contact with the source region 104 and the body region 102.

The body region 102 may comprise an anti-latch up zone 102-1 arranged in contact with the source region 104 and the contact metal 3. The anti-latch up zone 102-1 may be configured to reduce the natural voltage drop within the semiconductor body region 102 in the vicinity of the source region 104 during operation of the semiconductor device 1. For example, the anti-latch up zone 102-1 may exhibit higher electric conductivity than the body region 102 external of the anti-latch up zone 102-1. For example, the anti-latch up zone 102-1 is configured to prevent a latch up, i.e. an ignition of a parasitic thyristor inside an IGBT.

For establishing and electrical connection with the semiconductor body 10, the second load terminal C may comprise a back side contact metal 4 arranged in contact with the back side 10-2 of the semiconductor body 10. A back side semiconductor region 107 of the semiconductor body 10 can be arranged in contact with the back side contact metal 4. For example, the back side semiconductor region 107 may form a p-doped backside emitter of an n-channel IGBT. In another embodiment, the back side semiconductor region 107 may comprise both p-doped zones 107-1 and n-doped zones 107-2 forming IGBT regions and diode regions, respectively, at the back side 10-2 of a reverse conducting n-channel IGBT. In yet another embodiment, the back side semiconductor region 107 may, for example, form and $n^+$-doped contact layer 107 at the back side 10-2 of an n-channel MOSFET.

In the above, optional common features of the embodiments illustrated in FIGS. 2A to 2E have been described. In the following, several possible configurations of the reduced band gap zone 102-2 inside the body region 102 will be explained with reference to the FIGS. 2A to 2F.

Figure 2A:
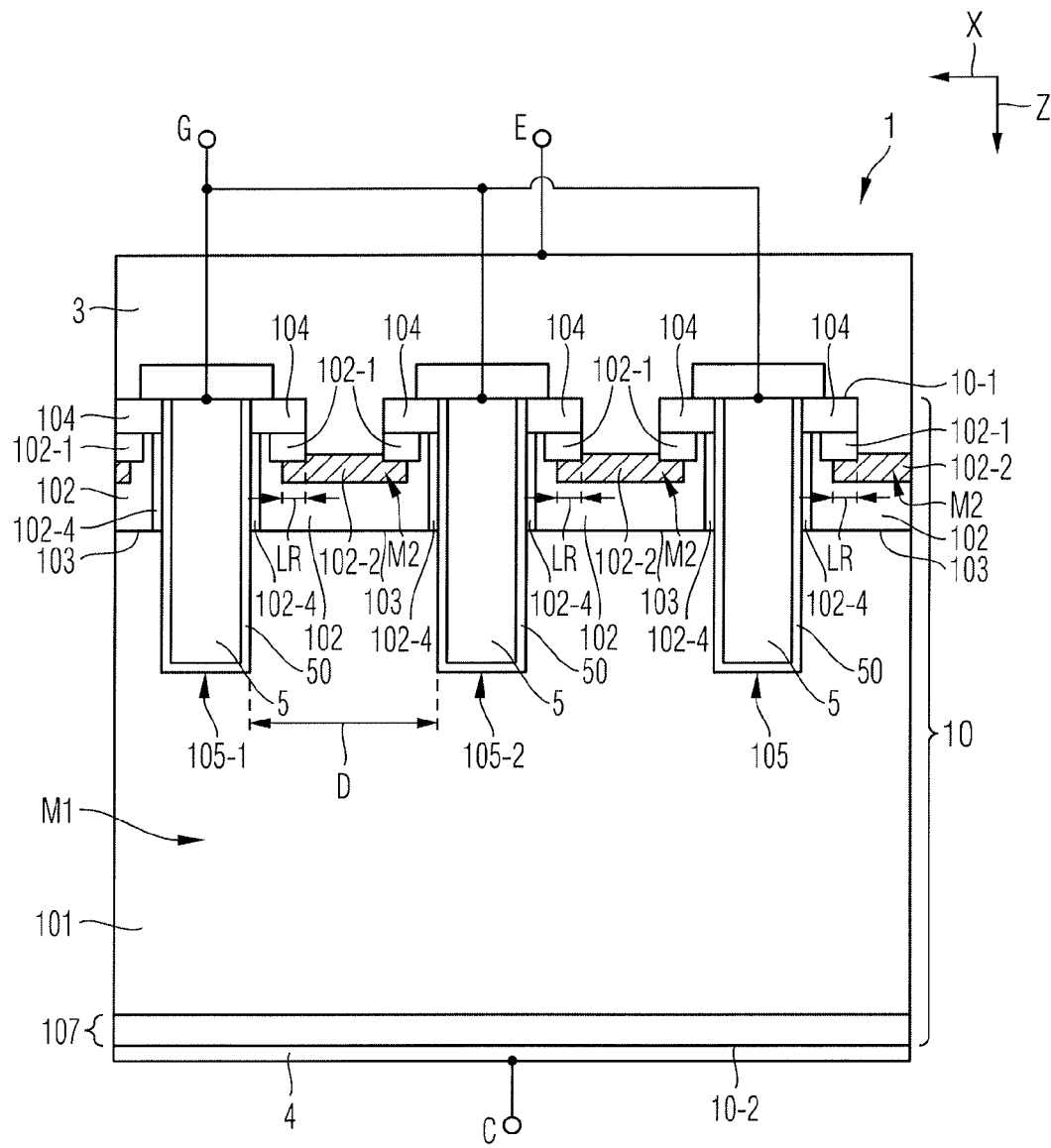
FIG. 2A schematically illustrates a section of a vertical cross-section of a semiconductor device having a body region according to one or more embodiments.

In accordance with the embodiment illustrated in FIG. 2A, the reduced band gap zone 102-2 may be in contact with the contact metal 3. The reduced band gap zone 102-2 may extend along the first lateral direction X along a bottom of a contact groove arranged between two source regions 104 and two anti-latch up zones 102-1 inside each transistor cell. The contact groove may be filled with the contact metal 3. The reduced band gap zone 102-2 may extend laterally along the first lateral direction X below the source region 104. The reduced band gap zone 102-2 and the source region 104 exhibit a common lateral extension range LR along the first lateral direction X in the depicted cross-section along the vertical direction Z. For example, the common lateral extension range LR amounts to at least 100 nm.

A transition between the reduced band gap zone 102-2 and the contact metal 3 may form a semiconductor-to-metal transition exhibiting a relatively low contact resistance. For example, such relatively low contact resistance may be established due to the smaller band gap of the second semiconductor material M2 of the reduced band gap zone 102-2. The contact resistance between the reduced band gap zone 102-2 and the contact metal 3 may be lower than a contact resistance between the contact metal 3 and a semiconductor region comprising the first semiconductor material M1 having dopants of the second conductivity type at the same dopant concentration as the reduced band gap zone 102-2. For example, the second semiconductor material M2 comprises silicon germanium and the contact metal 3 comprises at least one of aluminum, aluminum copper, aluminum silicon copper, titanium, titanium tungsten, titanium nitride, tantalum, tantalum nitride, polycrystalline silicon, and a silicide such as platinum silicide.

Within a transistor cell, the reduced band gap zone 102-2 may, for instance, extend for at least 20% of a horizontal distance D between the first gate trench 105-1 and the second gate trench 105-2 along the first lateral direction X. In other embodiments, the reduced band gap zone 102-2 may extend along the first lateral direction X for at least 30%, 40%, 50%, or even more than 60% of the horizontal distance D.

The second semiconductor material M2 may provide for a higher charge carrier mobility for charge carriers of the first conductivity type (for example electrons) and/or for charge carriers of the second conductivity type (for example holes) as compared to the first semiconductor material M1 having dopants of the same conductivity type at the same doping level as the second semiconductor material M2.

For example, the configuration of semiconductor device 1 depicted in FIG. 2A may be employed for forming a reverse conducting IGBT, wherein the reduced band gap zone 102-2 may be configured to ensure a low emitter efficiency of the body region 102 so as to reduce a reverse recovery charge for the diode operation of the reverse conducting IGBT. For example, in case of an n-channel reverse conducting IGBT, the reduced band gap zone 102-2 may be configured to ensure an effective outflow of electrons to the contact metal 3. For example, this may be a consequence of the relatively high mobility of the second semiconductor material M2 and/or the relatively low contact resistance of the semiconductor-to-metal transition formed at the transition between the reduced band gap zone 102-2 and the contact metal 3.

Figure 2B:
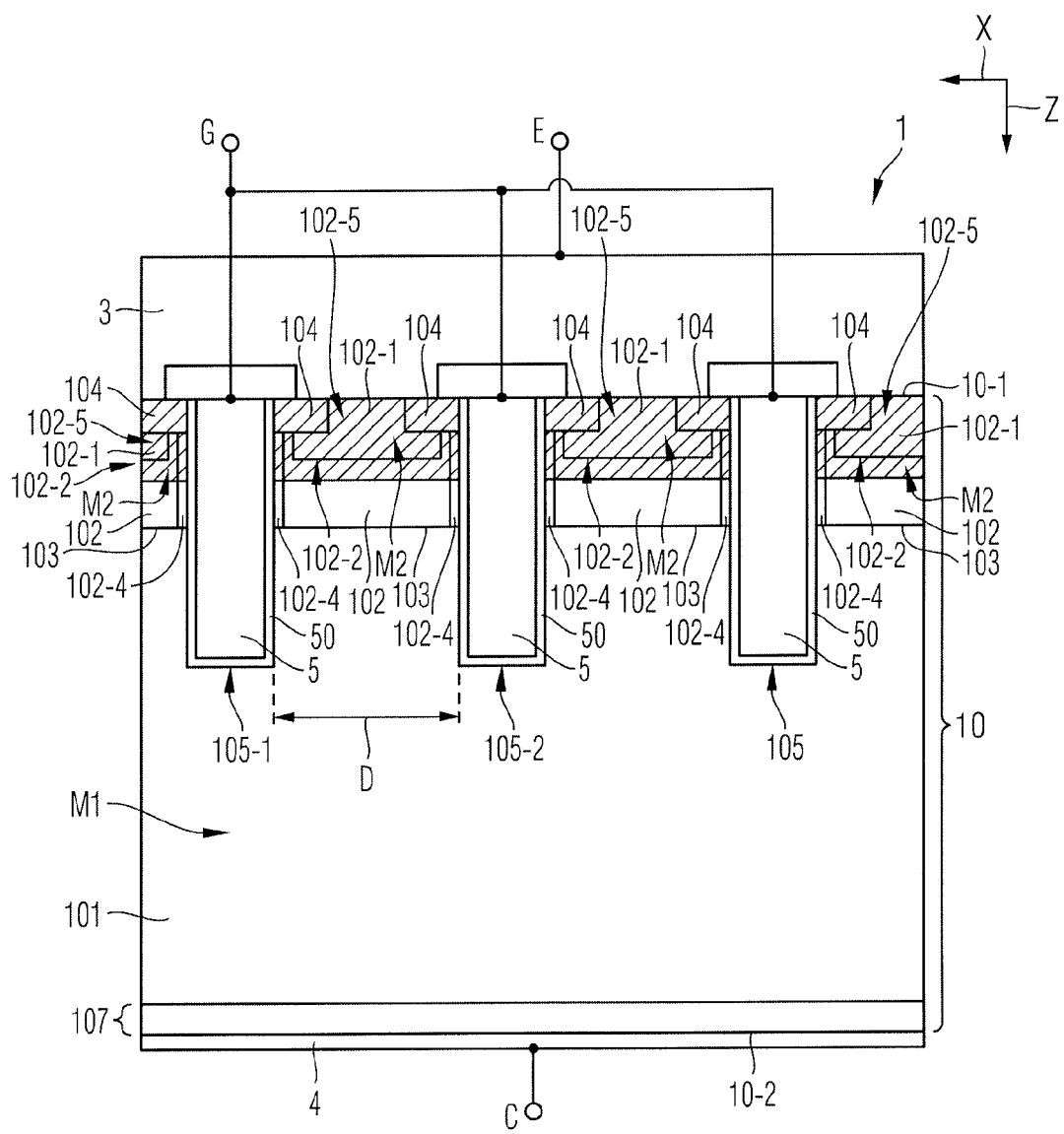
FIG. 2B schematically illustrates a section of a vertical cross-section of a semiconductor device having a body region according to one or more embodiments.

As illustrated in FIG. 2B, it is also possible to provide the second semiconductor material M2 in portions of the MOS control head that extend beyond the body region 102. In accordance with the exemplary embodiment of FIG. 2B, the second semiconductor material M2 is present in both the source region 104 and the reduced band gap zone 102-2, the latter forming a sizable upper portion of the body region 102 including the anti-latch up region 102-1. For example, the reduced band gap zone 102-2 may form at least 20% of a volume of the body region 102. In other embodiments, the reduced band gap zone 102-2 may form 30%, 40%, 50%, or even more than 60% of a volume the body region 102.

For example, the reduced band gap zone 102-2 forms the entire anti-latch up zone 102-1, as depicted in FIG. 2B. In other embodiments, the anti-latch up zone 102-1 and the reduced band gap zone 102-2 may at least exhibit a common overlap region 102-5. As a consequence of a relatively high mobility of the second semiconductor material M2 and/or of a relatively low contact resistance of the semiconductor-to-metal transition between the anti-latch up zone 102-1 and the contact metal 3, an overcurrent robustness of the semiconductor device may be improved. Additionally or alternatively, a doping level of the anti-latch up zone 102-1 may be reduced, thereby reducing an undesired counter-doping of the source region 104 during production of the semiconductor device 1, thereby increasing its conductivity.

In an embodiment, the reduced band gap zone 102-2 extends into the channel region 102-4, as illustrated in FIG. 2B. In a variant, the common overlap region 102-5 of the anti-latch up zone 102-1 and the reduced band gap zone 102-2 may extend into the channel region 102-4 (not depicted). A high mobility of the second semiconductor material M2 and/or a low contact resistance with the contact metal 3 may allow for providing a relatively low doping level inside the overlap region 102-5 such that an appropriate threshold voltage of the semiconductor device 1 may be achieved even if the overlap region 102-5 extends into the channel region 102-4. Furthermore, due to the smaller band gap of the second semiconductor material M2, a threshold voltage pertaining to a channel region 102-4 also including the second semiconductor material M2 can be lower than a threshold voltage pertaining to a general region 102-4 including only the first semiconductor material M1.

In accordance with the embodiment of FIG. 2B, also the source region 104 may comprise the second semiconductor material M2. The second semiconductor material M2 may exhibit a relatively high mobility as compared to the mobility of the first semiconductor material M1 at a similar doping level. Further, as explained above, the semiconductor-to-metal transition formed at the transition between the source region 104 and the contact metal 3 may have a relatively low contact resistance. Thus, a doping level of the source region 104 may be chosen comparably low if a certain conductivity of the source region 104 shall be reached.

Figure 2C:
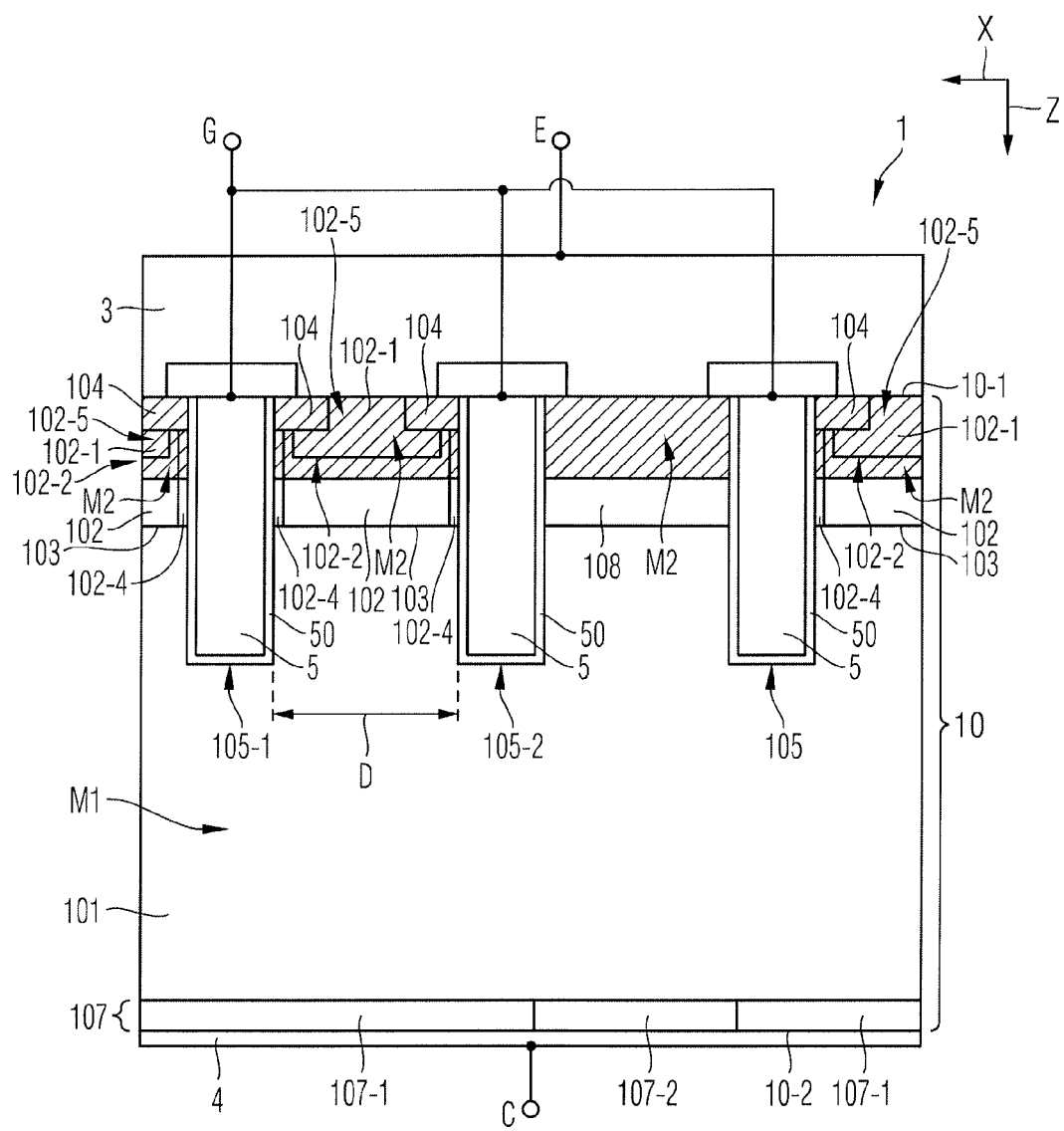
FIG. 2C schematically illustrates a section of a vertical cross-section of a semiconductor device having a body region according to one or more embodiments.

FIG. 2C schematically illustrates a variant of the semiconductor device 1 described above with regards to FIG. 2B. In the embodiment of FIG. 2C, the semiconductor device 1 exhibits, in addition to transistor cells as described above, at least one diode cell arranged between two gate trenches 105-1, 105-2. For example, the diode cell does not comprise a source region 104, a channel region 102-4, or an anti latch-up zone 102-1. Instead, the diode cell may comprise an anode region 108, which may comprise the second semiconductor material M2.

In the exemplary embodiment of FIG. 20, a sizable upper portion of the anode region 108 may consist of the second semiconductor material M2. A transition between the upper portion of the anode region 108 and the contact metal 3 forms a semiconductor-to-metal transition, which may have a relatively low contact resistance. For example, due to a relatively high mobility of the second semiconductor material M2, a doping level of the anode region 108 may be chosen relatively low, resulting in the low emitter efficiency of the anode region 108.

The diode cell of the semiconductor device 1 may be arranged substantially opposite to a diode region 107-2 of the back side semiconductor region 107. The diode region 107-2 may have dopants of the first conductivity type and be arranged laterally adjacent to semiconductor regions 107-1 of the back side semiconductor region 107, the semiconductor regions 107-1 having dopants of the second conductivity type.

The configuration of the semiconductor device 1 of FIG. 20 may be employed for forming a vertical power semiconductor device, such an RC-IGBT.

Figure 2D:
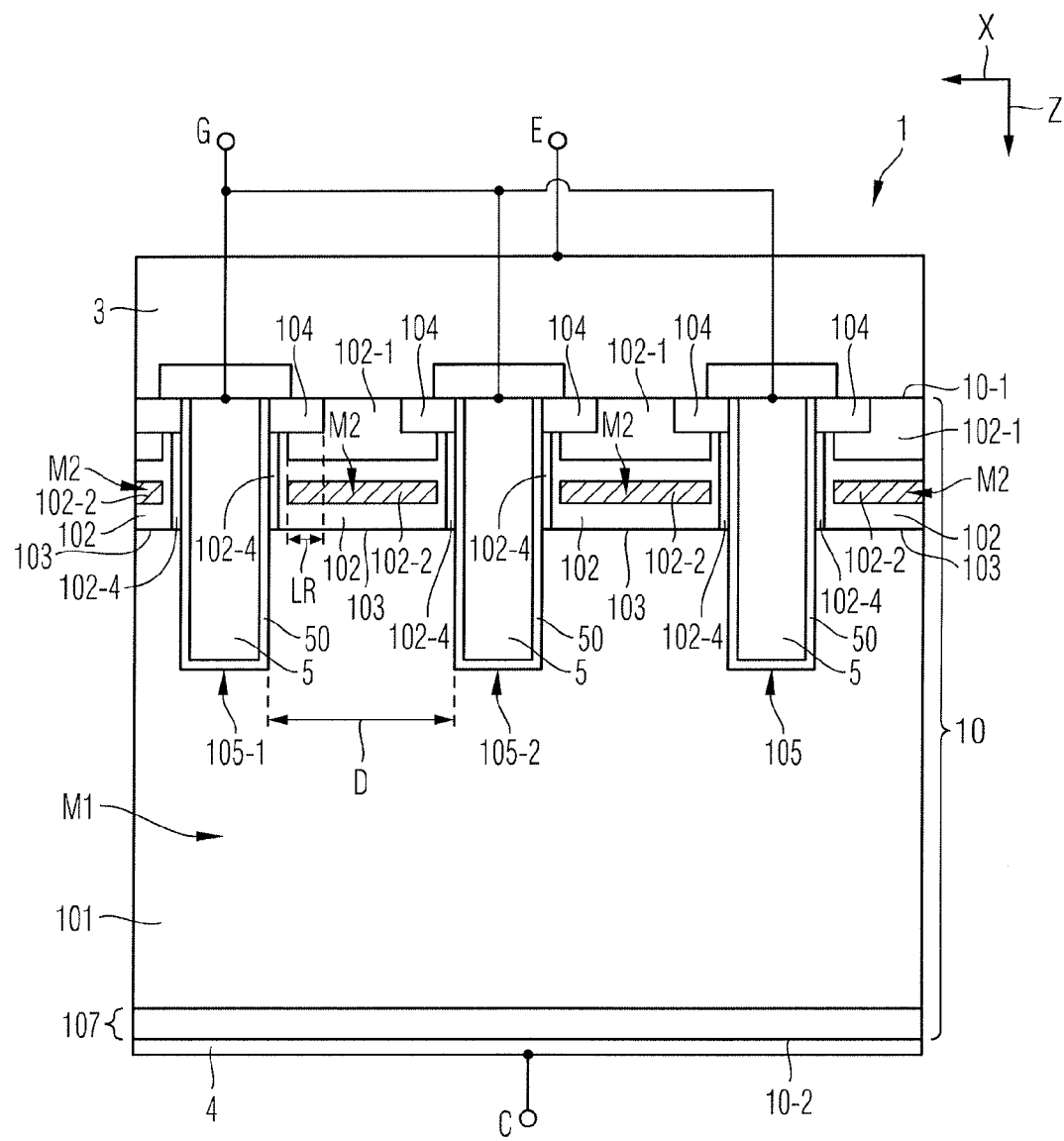
FIG. 2D schematically illustrates a section of a vertical cross-section of a semiconductor device having a body region according to one or more embodiments.

FIG. 2D schematically depicts another embodiment of the semiconductor device 1 comprising a reduced band gap zone 102-2 inside the body region 102 of the transistor cell. In this embodiment, the reduced band gap zone 102-2 may extend along the first lateral direction X at a certain depth below the source regions 104 and the anti-latch up zone 102-1. In other words, the reduced band gap zone 102-2 may be buried inside the body region 102.

A semiconductor hetero transition between a part of the body region 102 comprising the first semiconductor material M1 and the reduced band gap zone 102-2 comprising the second semiconductor material M2 may exhibit a potential step for charge carriers of the second conductivity type. Hence, and outflow of charge carriers of the second conductivity type towards the contact metal 3 along a geometrically direct path may be hindered due to the presence of the reduced band gap zone 102-2. This may result in increased charge carrier concentration of the second conductivity type underneath the reduced band gap zone 102-2, which, in turn, may result in reduced losses in a bipolar conducting state of the semiconductor device 1.

For example, the first semiconductor material M1 is silicon and the second semiconductor material M2 is silicon germanium. The height of said potential step at the semiconductor hetero transition may be adjusted, e.g., linearly, by changing the germanium content of the second semiconductor material M2, wherein the potential step may be varied between 0 V (e.g., corresponding to pure silicon) and 0.37 eV (e.g., corresponding to 100% germanium).

As shown in FIG. 2E, in a further embodiment, the reduced band gap zone 102-2 comprises a lower region 102-2A similar to the reduced band gap zone 102-2 in FIG. 2D and, in addition, an upper region 102-2B that extends along the vertical direction Z up to the contact metal 3. Thus, in this exemplary embodiment, the reduced band gap zone 102-2 is not entirely buried below the source regions 104 and the anti-latch up zones 102-1. In this variant, in addition to the effect on the charge carrier distribution described above with reference to FIG. 2D, a relatively low contact resistance between the body region 102, namely the upper region 102-2B of the reduced band gap zone 102-2, and the contact metal 3 may be achieved. An integral doping level of the body region 102 may thus be reduced as compared to a situation without the reduced band gap zone 102-2. As a consequence, an emitter efficiency of the body region 104, for example of a reverse conducting IGBT, may be reduced.

Figure 2F:
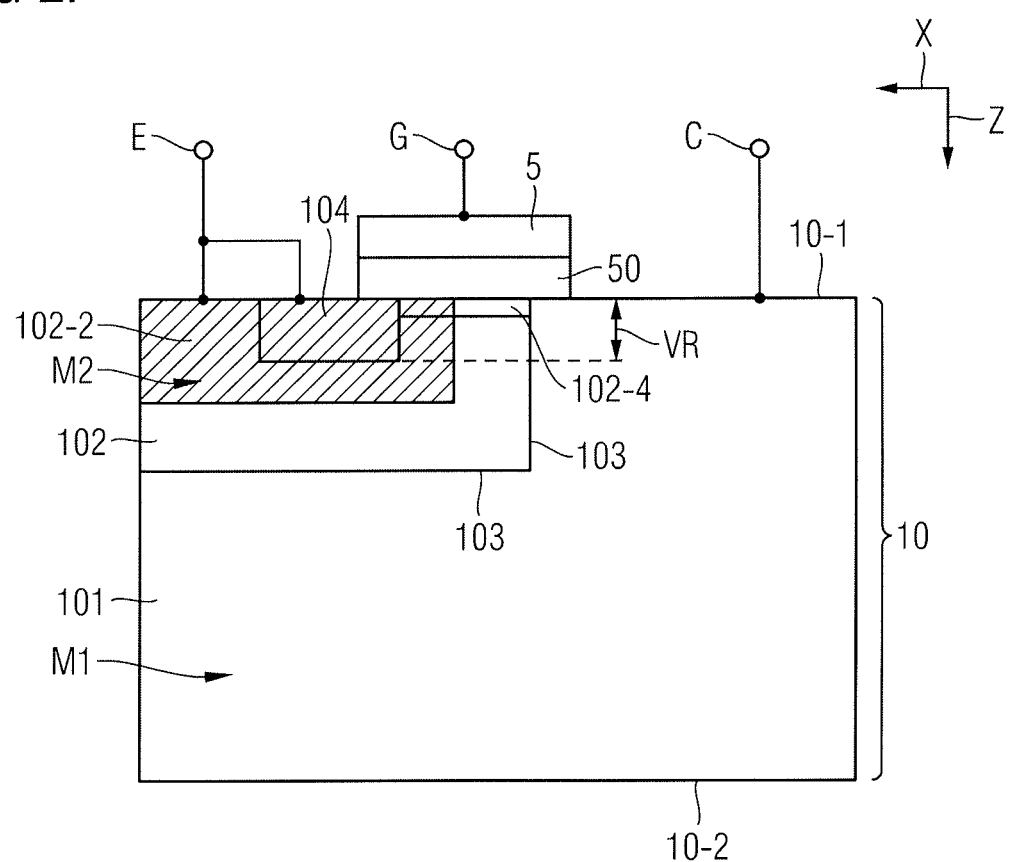
FIG. 2F schematically illustrates a section of a vertical cross-section of a semiconductor device having a body region according to one or more embodiments.

FIG. 2F schematically illustrates a semiconductor device 1 according to a further embodiment. In this embodiment, the semiconductor device 1 exhibits a lateral structure, wherein both the first load terminal E and the second load terminal C are coupled to the front side 10-1 of the semiconductor body 10. The semiconductor device 1 is configured to conduct the load current between the first load terminal E and the second load terminal C, e.g., substantially along the first lateral direction X. Correspondingly, the gate electrode 5 may be a planar gate electrode that extends along the first lateral direction X in the vicinity of the front side 10-1 of the semiconductor body 10. The planar gate electrode 5 is insulated from the source region 104, the body region 102, and the drift region 101 by an insulator 50 and is configured to induce an inversion channel in the channel region 102-4 in the vicinity of the front side 10-1 of the semiconductor body 10.

In the embodiment of FIG. 2F, the reduced band gap zone 102-2 may surround the source region 104, which may also comprise the second semiconductor material M2. The reduced band gap zone 102-2 may extend into the channel region 102-4. In the cross-sectional view shown in FIG. 2F, the reduced band gap zone 102-2 and the source region 104 exhibit a common vertical extension range VR along the vertical direction Z.

Figure 3A:
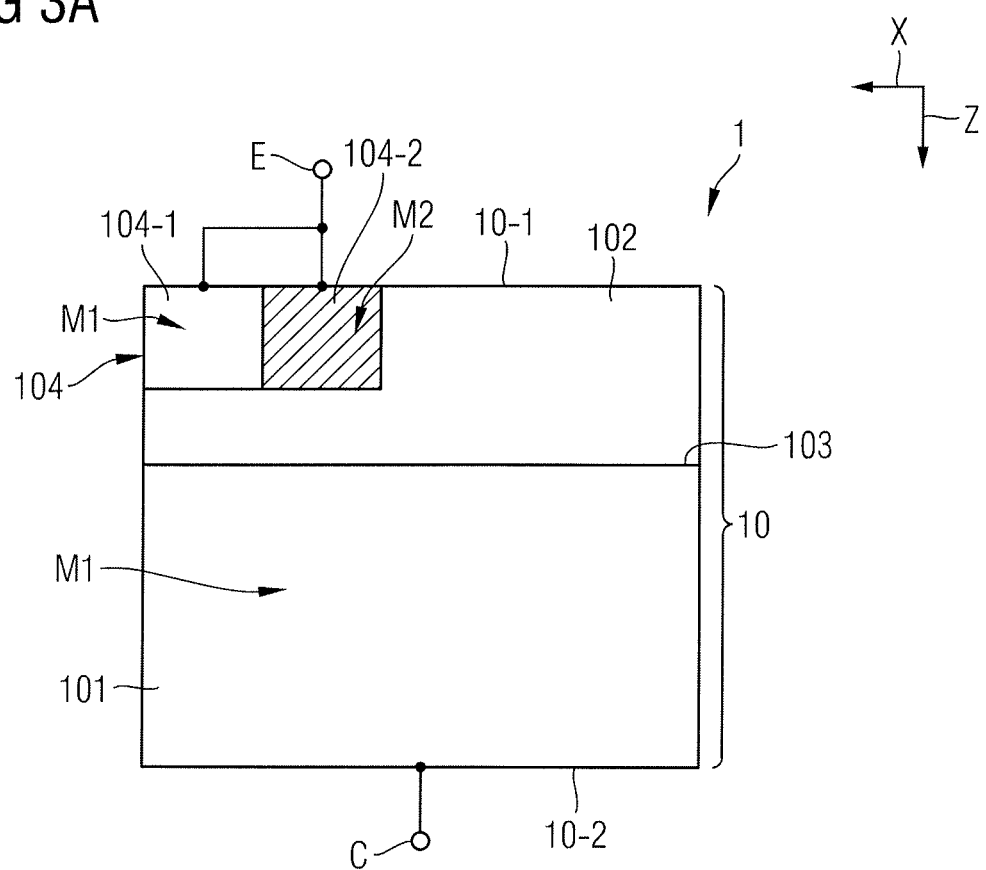
FIG. 3A schematically illustrates a section of a vertical cross-section of a semiconductor device having a source region according to one or more embodiments.

FIG. 3A schematically illustrates a semiconductor device 1 according to one or more embodiments. The semiconductor device 1 comprises a semiconductor body 10 coupled to a first load terminal E and a second load terminal C. The exemplary embodiment shown in FIG. 3A may exhibit a vertical set-up, wherein the first load terminal E is arranged at the front side 10-1 of the semiconductor body 10 and the second load terminal C is arranged at a back side 10-2 of the semiconductor body 10. According to another embodiment, both the first load terminal E and the second load terminal C may be arranged, for example, at the front side 10-1 of the semiconductor body 10, thereby forming a lateral set-up, e.g., similar to the embodiment illustrated in FIG. 2F.

As described above with regards to the embodiments of FIGS. 1 to 2F, the semiconductor body 10 includes a drift region 101 comprising a first semiconductor material M1 having a first band gap, wherein the drift region 101 has dopants of a first conductivity type and is configured to carry at least a part of a load current between the first load terminal E and the second load terminal C. The semiconductor body 10 further includes a body region 102 having dopants of a second conductivity type complementary to the first conductivity type. A transition between the semiconductor body region 102 and the drift region 101 forms a pn-junction 103, which is configured to block a voltage applied between the first load terminal E and the second load terminal C.

The semiconductor body 10 further comprises a source region 104 having dopants of the first conductivity type, the source region 104 being electrically connected to the first load terminal E and being isolated from the drift region 101 by the semiconductor body region 102.

The source region 104 includes a first source zone 104-1 comprising the first semiconductor material M1 and a second source zone 104-2 arranged adjacent to the first source zone 104-1 and comprising a second semiconductor material M2 having a second band gap that is smaller than the first band gap. For example, the first load terminal E is electrically connected to the second source zone 104-2.

What has been stated about the first and second semiconductor materials M1, M2 may apply equally to the embodiment of FIG. 3A. For example, the first semiconductor material M1 is silicon and the second semiconductor material M2 is silicon germanium. In other embodiments, the first semiconductor material M1 may be gallium arsenide and the second semiconductor material M2 may be germanium.

Figure 3B:
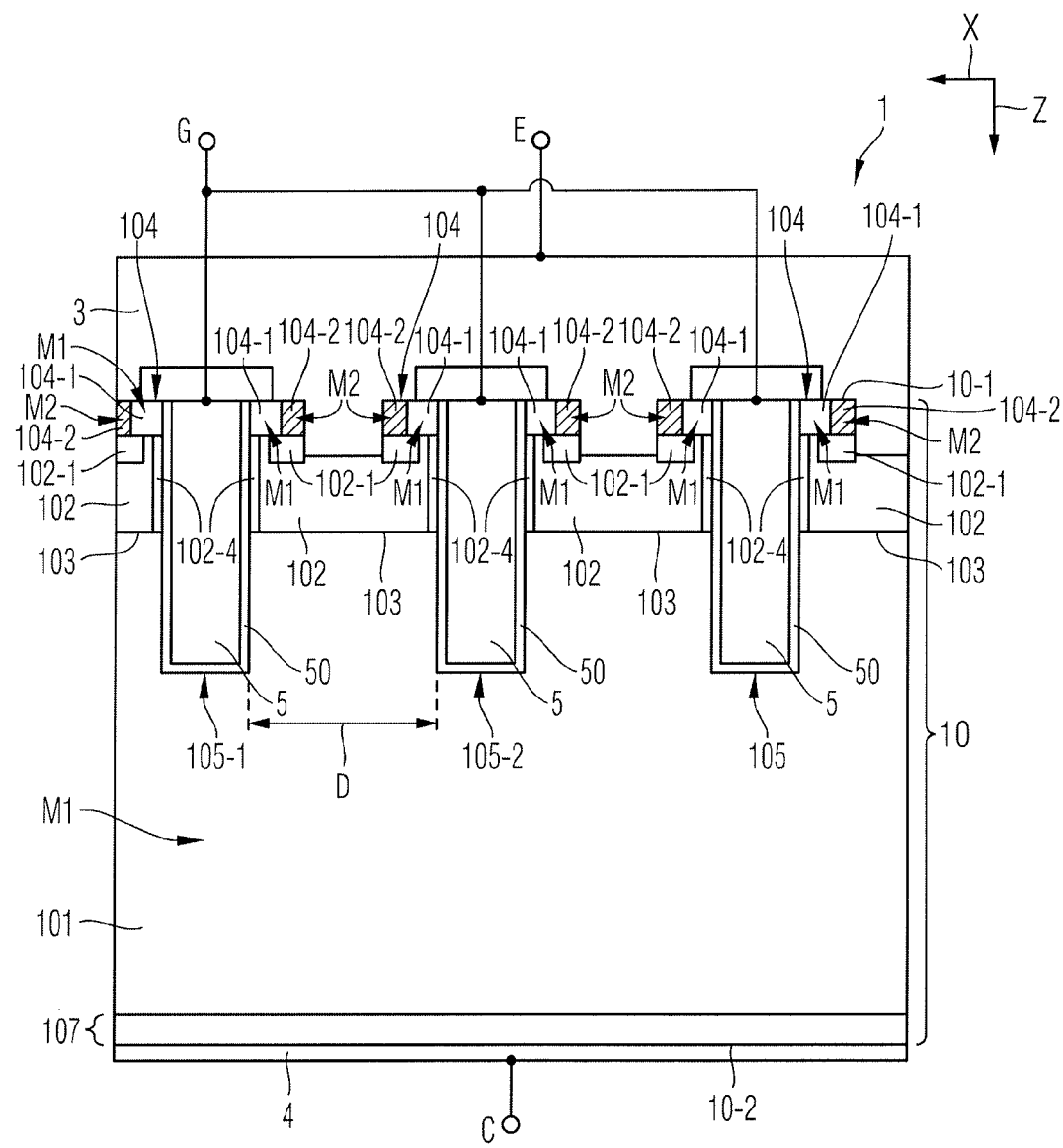
FIG. 3B schematically illustrates a section of a vertical cross-section of a semiconductor device having a source region according to one or more embodiments.
Figure 3C:
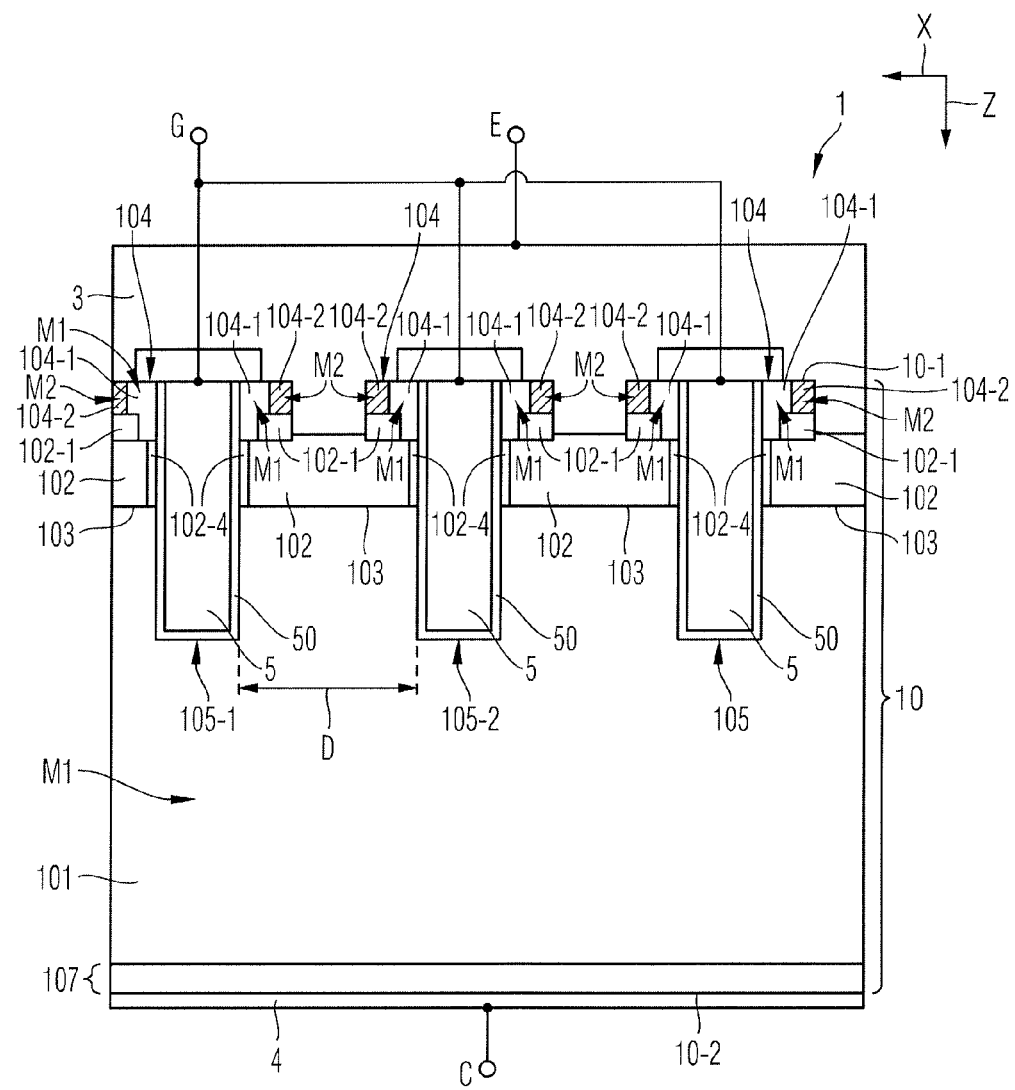
FIG. 3C schematically illustrates a section of a vertical cross-section of a semiconductor device having a source region according to one or more embodiments.

FIGS. 3B and 3C each schematically illustrate a semiconductor device 1 exhibiting a similar set-up as the embodiments explained above with respect to FIGS. 2A to 2E. For example, the semiconductor devices 1 of FIG. 3B and FIG. 3C may be employed for realizing a vertical trench IGBT, a reverse conducting vertical trench IGBT, or a vertical trench MOSFET.

The source regions 104 of the transistor cells each comprise the first source zone 104-1 comprising the first semiconductor material M1 and the second source zone 104-2 arranged laterally adjacent to the first source zone 104-1 and comprising the second semiconductor material M2. According to another embodiment, at least one second source zone 104-2 may be arranged vertically adjacent to at least one first source zone 104-1 (not depicted).

As illustrated in FIG. 3B, the contact metal 3 forming a part of the first load terminal E may be arranged in contact with each of the semiconductor body region 102 and the second source zone 104-2. For example, a transition between the second source zone 104-2 and the contact metal 3 is configured to form a semiconductor-to-metal transition exhibiting a contact resistance that is lower as compared to a contact resistance of a semiconductor-to-metal transition formed at a transition between the first source zone 104-1 and the contact metal 3.

According to an embodiment, the first source zone 104-1 is arranged in contact with the insulator 50 insulating the gate electrode 5 from the source region 104. In the embodiment illustrated in FIG. 3B, the first source region 104-1 is arranged in contact with each of the insulator 50 and the channel region 102-4.

Each of the first source region 104-1 and the second source region 104-2 may be arranged above the anti-latch up zone 102-1, as illustrated in FIG. 3B. FIG. 3C illustrates an embodiment of a semiconductor device 1, wherein the lower portion of the first source zone 104-1 is arranged laterally adjacent to the anti-latch up zone 102-1, isolating the anti-latch up zone 102-1 from the insulator 50 of the gate trench 105, 105-1, 105-2.

FIG. 4 schematically illustrates a section of a vertical cross-section of a semiconductor device 1 according to one or more embodiments. The semiconductor device 1 comprises a semiconductor body 10 coupled to a first load terminal E and a second load terminal C. In accordance with FIG. 4, the first load terminal E is arranged at a front side 10-1 of the semiconductor body 10, whereas the second load terminal C is arranged at a back side 10-2 of the semiconductor body 10. In other embodiments, each of the first load terminal E and the second load terminal C may be arranged, for example, at the front side 10-1 of the semiconductor body 10.

The semiconductor body 10 includes a first semiconductor layer 110 comprising a first semiconductor material M1 having a first band gap, wherein the first semiconductor layer 110 is configured to carry at least a part of a load current between the first load terminal E and the second load terminal C. For example, the first semiconductor layer 110 may form at least a part of an n-doped drift layer 101 of a diode, an IGBT, a reverse conducting IGBT, or a MOSFET. The first semiconductor material M1 of the first semiconductor layer 110 may be, for example, silicon. In accordance with other embodiments, the first semiconductor material M1 may be, for example, gallium arsenide.

The semiconductor body 10 further comprises an emitter layer 120 being in contact with the first semiconductor layer 110 and being configured to inject charge carriers into the first semiconductor layer 110.

In an embodiment, a dopant concentration of the emitter layer 120 is higher than a dopant concentration of the first semiconductor layer 110, e.g., by a factor of at least 10. In other embodiments, the dopant concentration of the emitter layer 120 may be higher than the dopant concentration of the first semiconductor layer 110 by a factor of at least 50 or even more than 100.

In accordance with the embodiment illustrated in FIG. 4, the emitter layer 120 includes the first emitter zone 121 comprising a first semiconductor material M1 and a second emitter zone 122 arranged laterally adjacent to the first emitter zone, wherein the second emitter zone 122 comprises a second semiconductor material M2 having a second band gap that is smaller than the first band gap of the first semiconductor material M1.

What has been stated above about the first semiconductor material M1 and the second semiconductor material M2 may equally apply to the embodiment illustrated in FIG. 4 and to the embodiments, which will be described in the following with reference to FIGS. 5 to 7. Accordingly, the second band gap may be smaller than the first band gap by at least 0.1 eV. In an embodiment, silicon may be used as the first semiconductor material M1, whereas silicon germanium may be used as the second semiconductor material M2.

In accordance with the embodiment depicted in FIG. 4, the semiconductor device 1 may further comprise a metal layer 20 being electrically connected with one of the first load terminal E and the second load terminal C and being arranged in contact with the emitter layer 120. In the exemplary embodiment illustrated in FIG. 4, the metal layer 20 is arranged at the back side 10-2 of the semiconductor body 10 and is electrically connected to the second load terminal C. In other embodiments, both the emitter layer 120 and the metal layer 20 may be arranged at the front side 10-1 of the semiconductor body 10. For example, the metal layer 20 may form the contact metal 3 being electrically connected to the first load terminal E, as described above in connection with FIGS. 2A to 2E and FIGS. 3B to 3C.

A transition between the metal layer 20 and the first emitter zone 121 forms a first semiconductor-to-metal transition 201 exhibiting a first contact resistance, and a transition between the metal layer 20 and the second emitter zone 122 forms a second semiconductor-to-metal transition 202 exhibiting a second contact resistance, wherein the second contact resistance is smaller than the first contact resistance.

In accordance with an embodiment, the first semiconductor material M1 may be silicon and the second semiconductor material M2 may be silicon germanium having dopants of the same conductivity type at a similar dopant concentration as the first semiconductor material M1. The contact metal 20 may, for example, comprise at least one of aluminum, aluminum copper, aluminum silicon copper, titanium, titanium tungsten, titanium nitride, tantalum, tantalum nitride, polycrystalline silicon, and a silicide such as platinum silicide.

In an embodiment, the first semiconductor-to-metal transition 201 may be configured to provide a Schottky contact between the metal layer 20 and the first emitter zone 121, whereas the second semiconductor-to-metal transition 202 may be configured to provide an ohmic contact between the metal layer 20 and the second emitter zone 122. For example, the emitter layer 120 may comprise phosphorous atoms as n-type dopants, wherein a dopant concentration may be in a range between $10^{18}$ and $10^{19}$ cm$^{-3}$.

In an embodiment, the at least one first emitter zone 121 and the at least one second emitter zone 122 arranged laterally adjacent to one another may establish a variation of an emitter efficiency of the emitter layer 120 along the first lateral direction X.

Figure 5:
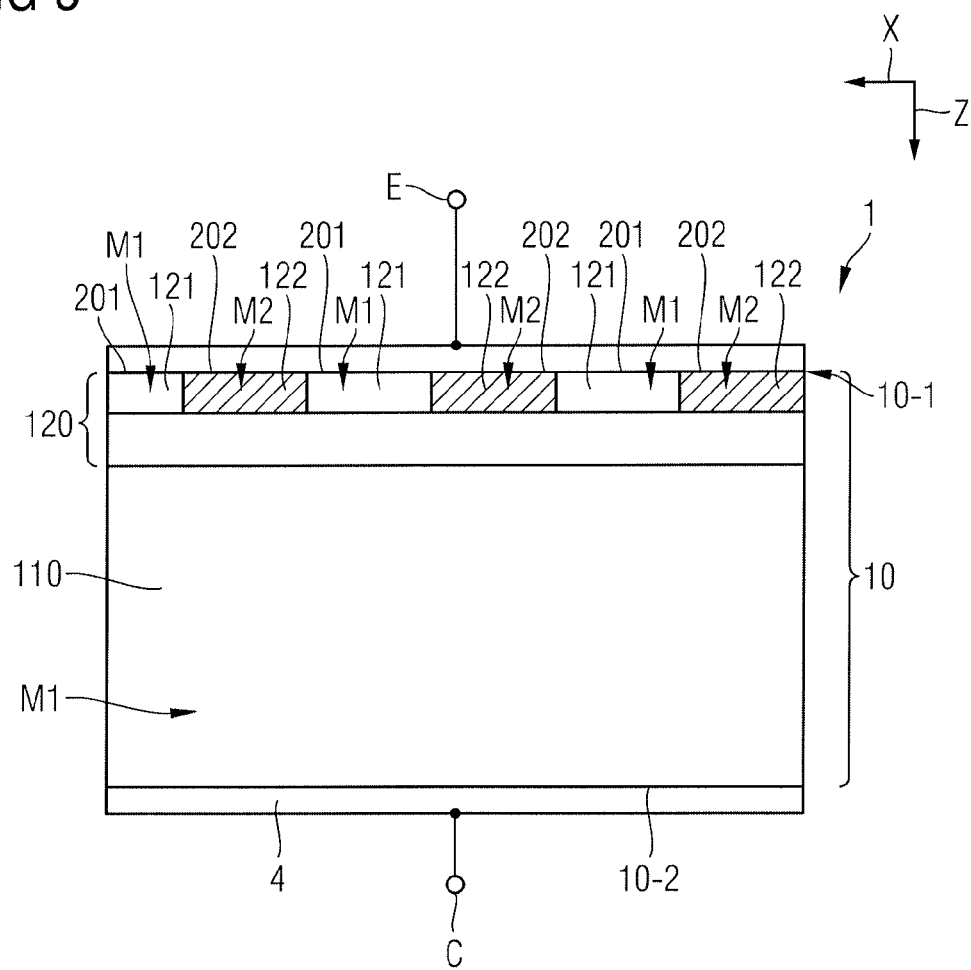
FIG. 5 schematically illustrates a section of a vertical cross-section of a semiconductor device having an emitter layer according to one or more embodiments.

In accordance with the embodiment of FIG. 5, the first semiconductor layer 110 may have dopants of a first conductivity type, and each of the first emitter zone 121 and the second emitter zone 122 may have dopants of a second conductivity type complementary to the first conductivity type. Correspondingly, a transition between the emitter layer 120 and the first semiconductor layer 110 may form a pn-junction.

For example, a semiconductor hetero transition between the second emitter zone 122 and the first semiconductor layer 110 may form a pn-junction, wherein a position of the pn-junction need not precisely coincide with a position of the semiconductor hetero transition. For example, due to an out-diffusion of charge carriers from the second emitter zone 122 into the first semiconductor layer 110, the pn-junction may be located inside the first semiconductor layer 110 in the vicinity of the second emitter zone 122.

For example, the configuration of the semiconductor device 1 of FIG. 5 may be employed for forming a diode, wherein the emitter layer 120 may form an emitter region of the diode. In accordance with FIG. 5, the emitter layer 120 may form, for example, an anode layer arranged at the front side 10-1 of the semiconductor body 10 in contact with the metal layer 20, which is electrically connected with the first load terminal E of the diode. First semiconductor-to-metal transitions 201 formed at transitions between the metal layer 20 and a plurality of first emitter zones 121 may exhibit a first contact resistance, whereas second semiconductor-to-metal transitions 202 formed at transitions between the metal layer 20 and a plurality of second emitter zones 122 may exhibit a second contact resistance that is smaller than the first contact resistance. For example, each of the first semiconductor-to-metal transitions 201 may be configured to provide a Schottky contact between the metal layer 20 and the first emitter zone 121 and each of the second semiconductor-to-metal transitions 202 may be configured to provide an ohmic contact between the metal layer 20 and the second emitter zone 122.

In accordance with the embodiment of FIG. 5, the second emitter zones 122 may be configured to inject charge carriers of the second conductivity type (for example holes) during a high load current situation (referred to as "Self-adjusting p-Emitter Efficiency Diode" concept, or abbreviated "SPEED" concept).

According to another embodiment, each of the first emitter zone 121, the second emitter zone 122, and the first semiconductor layer 110 may have dopants of the same conductivity type. For example, the configuration of the semiconductor device 1 of FIG. 5 may be employed for forming a pin-diode, wherein the emitter layer 120 may form an n-doped back side emitter of the pin-diode (not depicted).

Figure 6A:
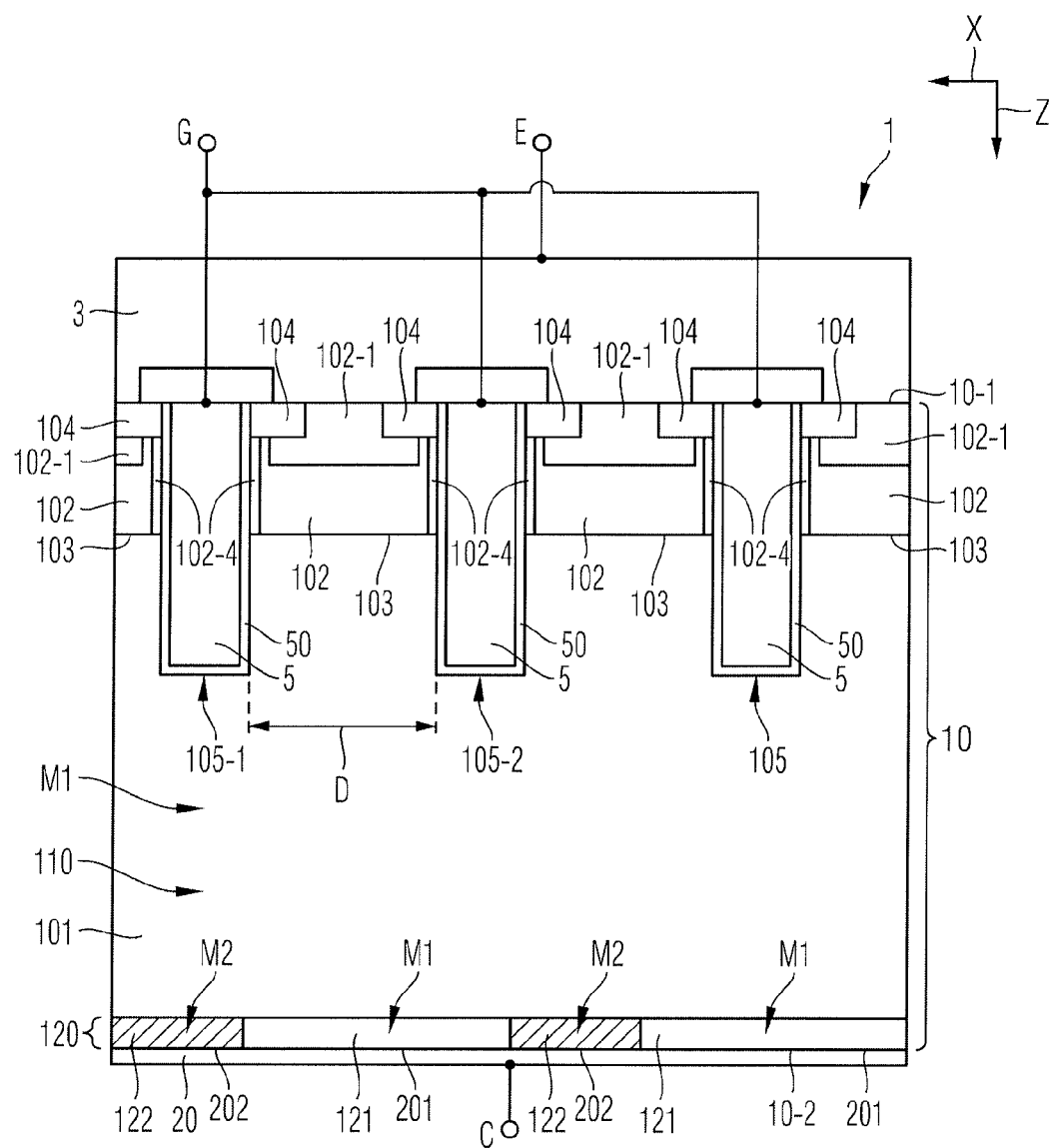
FIG. 6A schematically illustrates a section of a vertical cross-section of a semiconductor device having an emitter layer according to one or more embodiments.
Figure 6B:
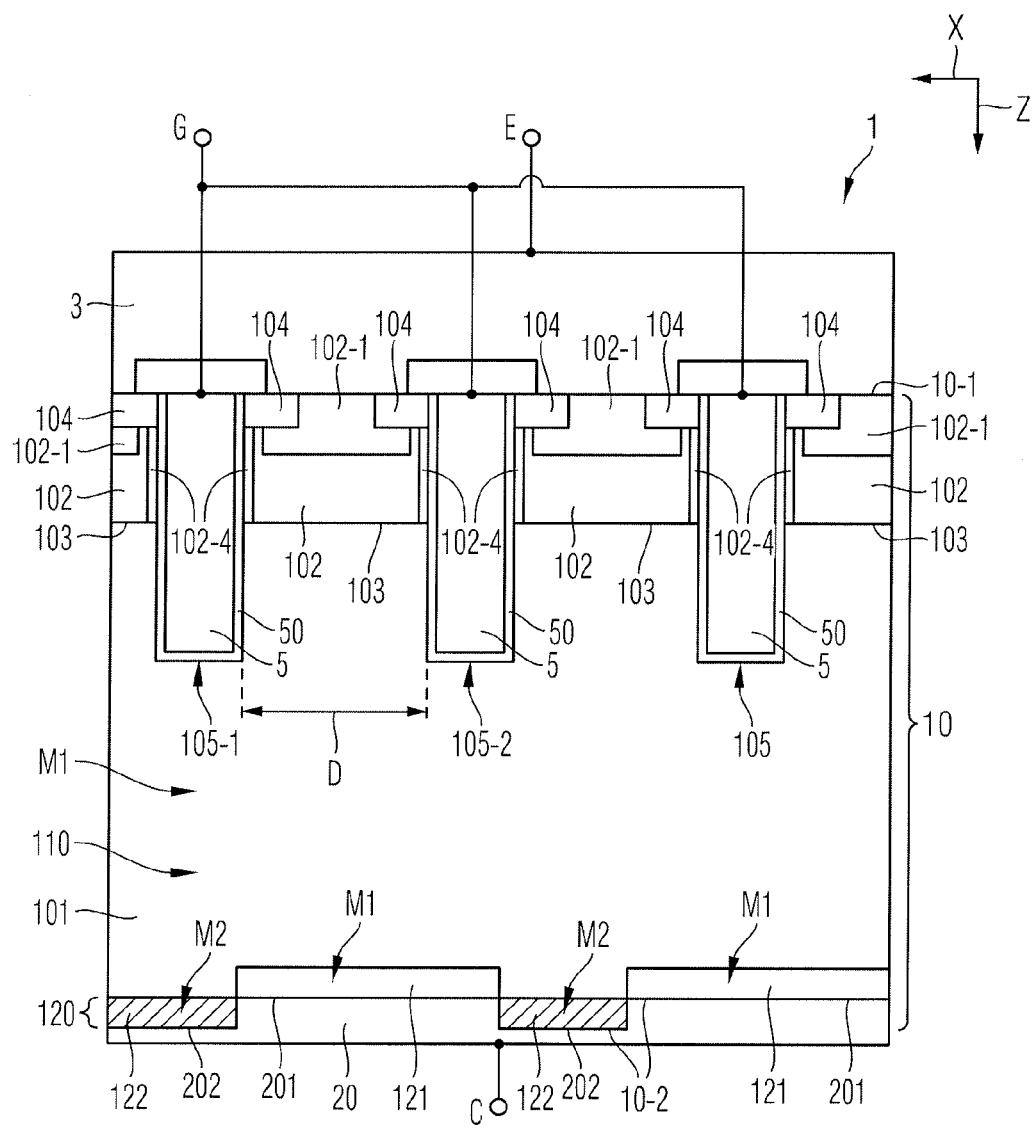
FIG. 6B schematically illustrates a section of a vertical cross-section of a semiconductor device having an emitter layer according to one or more embodiments.

The configuration of the semiconductor devices 1 in accordance with the embodiments of FIGS. 6A and 6B may be employed for forming an IGBT, wherein the emitter layer 120 may be electrically connected to the second load terminal C, and wherein the second load terminal C may form a collector terminal of the IGBT.

FIG. 6A schematically illustrates the semiconductor device 1 exhibiting a similar structure as the semiconductor devices 1 explained above with regards to FIGS. 2A to 2E and FIGS. 3B to 3C. The emitter layer 120 can be arranged in contact with the metal layer 20 at the back side 10-2 of the semiconductor body 10, wherein the metal layer 20 may be part of the second load terminal C forming, for example, a collector terminal of an IGBT. For example, the emitter layer 120 forms a p-doped back side emitter layer of an IGBT, wherein the second emitter zones 122 can be configured to locally inject holes during a certain operation state of the IGBT. For example, the second emitter zones 122 may be configured to increase a softness during switch off of the IGBT. Additionally or alternatively, the second source zones 122 may be configured to improve a short circuit ruggedness of the IGBT.

The configuration of the semiconductor device 1 in accordance with the embodiment of FIG. 6A also be employed for forming a reverse conducting IGBT, wherein the first semiconductor layer 110 comprises a drift region 101 having dopants of a first conductivity type. The emitter layer 120 may be electrically connected with the second load terminal C that may form a collector terminal of the reverse conducting IGBT. The first emitter zone 121 may have dopants of the second conductivity type complementary to the first conductivity type, whereas the second emitter zone 122 may have dopants of the first conductivity type. For example, for forming a reverse conducting n-channel IGBT, the first emitter zones 121 may be p-doped IGBT regions, whereas the second emitter zones 122 may be n-doped diode regions.

FIG. 6B schematically illustrates a semiconductor device 1, such as a part of a reverse conducting IGBT, which differs from the embodiment of FIG. 6A in that, within the emitter layer 120 arranged at the back side 10-2 of the semiconductor body 10, the first emitter zones 121 and the second emitter zones 122 are arranged laterally adjacent to one another in a staggered arrangement, wherein the first emitter zones 121 do not exhibit a common vertical extension range with the second emitter zones 122. Depending on a chosen fabrication process, this may constitute an alternative realization of an emitter layer 120, which can functionally be equivalent to the emitter layer 120 described above with reference to FIG. 6A.

Figure 7:
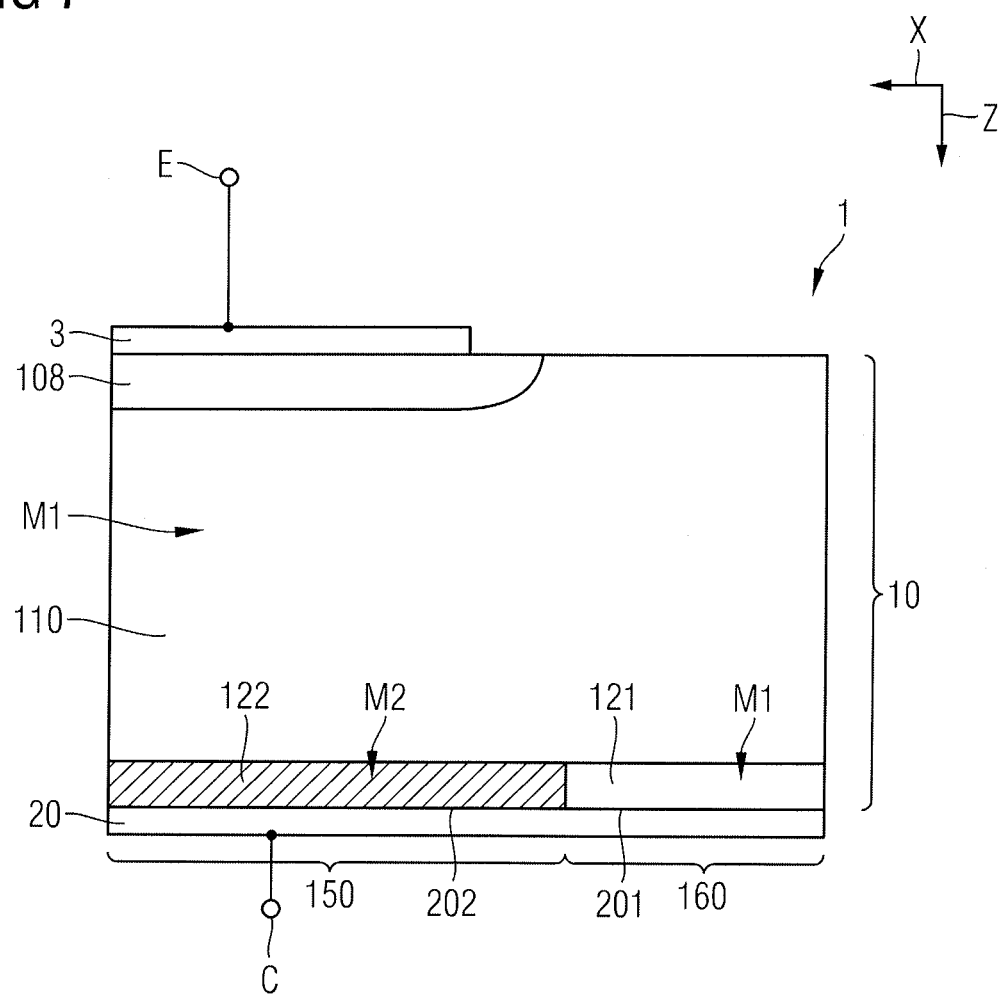
FIG. 7 schematically illustrates a section of a vertical cross-section of a semiconductor device having an emitter layer according to one or more embodiments.

As a further embodiment, FIG. 7 schematically illustrates a section of a vertical cross-section of a semiconductor device 1, wherein the first semiconductor layer 110 may be employed for forming at least a part of a drift region of a diode, and wherein the emitter layer 120 may form a cathode region of the diode. The second emitter zone 122 may be arranged within an active region 150 of the semiconductor body 10, wherein the active region 150 is configured to carry the load current. The first emitter zone 121 may be arranged within an edge region 160 of the semiconductor body 10, which, in a top view of the diode (not depicted), surrounds the active region 150 and extends along lateral edges of the semiconductor body 10.

For example, the second emitter zone 122 may comprise an n-doped silicon germanium layer, which may exhibit a relatively low doping level. A transition between the second emitter zone 122 and a back side metallization 20 may form an ohmic contact. By contrast, the first emitter zone 121 may comprise n-doped silicon at a similar doping level as the first emitter 121, wherein a transition between the first emitter zone 121 and the back side metallization 20 may form a Schottky contact.

The emitter layer 120 according to the embodiment illustrated in FIG. 7 may be configured to increase a switching robustness of a diode. For example, the emitter layer 120 of FIG. 7 may be employed for implementing a High dynamic robustness (HDR) concept.

In an embodiment, the second semiconductor material M2 may be silicon germanium, and one or more of the semiconductor regions comprising the second semiconductor material M2, for example the reduced band gap region 102-2 and/or the second emitter region 122, may exhibit a variation of a germanium content along the vertical direction Z. For example, the reduced band gap region 102-2, the second emitter region 122, and/or another region comprising silicon germanium as the second semiconductor material M2 may be configured to provide for a charge carrier mobility for charge carriers of the first conductivity type and/or for charge carrier of the second conductivity type, which varies along the vertical direction Z.

In an embodiment, a semiconductor hetero transition between regions comprising the first semiconductor material M1 (e.g., the drift region 101 or the first semiconductor layer 110) and regions comprising the second semiconductor material M2 (e.g., the reduced band gap region 102-2 or the second emitter zone 122) may be a sharp transition or a continuous transition. For example, the first semiconductor material M1 may be silicon and the second semiconductor material M2 may be silicon germanium, wherein a germanium content of the second semiconductor material M2 may increase continuously, e.g., along the vertical direction Z, at the semiconductor hetero transition between the first semiconductor material M1 and the second semiconductor material M2.

For example, a method of producing a semiconductor device 1 may comprise creating at least one region comprising silicon germanium adjacent to at least one region comprising silicon, wherein creating the at least one region comprising silicon germanium may comprise an epitaxial growth of silicon germanium along the vertical direction Z. In a variant, creating the at least one region comprising silicon germanium may comprise creating a spatial variation of a germanium content. For example, creating the region comprising silicon germanium by epitaxial growth may comprise creating a variation of the germanium content along the vertical direction Z.

The embodiments schematically illustrated in FIG. 1 to FIG. 7 and described above include the recognition that by providing, within a semiconductor device, semiconductor regions comprising a semiconductor material that has a smaller band gap than the semiconductor material of surrounding semiconductor regions, the injection and/or the flow of charge carriers may be influenced so as to optimize fundamental properties of the semiconductor device.

In accordance with one or more embodiments, it is proposed to provide a reduced band gap zone within the body region inside a MOS control head of a semiconductor device, wherein the reduced band gap zone comprises a semiconductor material exhibiting a smaller band gap than the surrounding semiconductor material. Thus, depending on the positioning of the reduced band gap zone, for example, conduction losses and/or switching losses of a semiconductor switching device may be reduced, or an over current robustness of the switching device may be increased.

In accordance with another embodiment, it is proposed to provide, within a source region of semiconductor device, a first source zone comprising a first semiconductor material having a first band gap arranged adjacent to a second source zone comprising a second semiconductor material having a second band gap, wherein the second band gap is smaller than the first band gap. Thus, for example, an overall emitter efficiency of the source region may be reduced, resulting in an increased over current robustness of the switching device. Furthermore, the commutation robustness of a reverse conducting IGBT or a MOSFET may be improved.

In accordance with yet another embodiment, it is proposed to provide, within a semiconductor device, an emitter layer exhibiting a laterally varying emitter efficiency, wherein the emitter layer includes a first emitter zone comprising a first semiconductor material having a first band gap and a second emitter zone comprising a second semiconductor material having a smaller band gap than the first semiconductor material. Such an emitter layer may form, for example, an anode layer of a diode, wherein SPEED structures may be realized by the lateral variation of the emitter efficiency. In other embodiments, the emitter layer may, for example, realize a locally enhanced backside emitter configured to increase the softness of an IGBT.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to semiconductor wafers and to methods and systems for processing a semiconductor wafer were explained. For example, these semiconductor wafers are based on silicon (Si). Accordingly, a monocrystalline semiconductor region or layer, e.g., the semiconductor regions 101, 102, 104, 107, and 120 of exemplary embodiments, can be a monocrystalline Si-region or Si-layer. In other embodiments, polycrystalline or amorphous silicon may be employed.

It should, however, be understood that the semiconductor regions 101, 102, 104, 107, and 120 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)—aluminum gallium indium nitride (AlGaInN), indium gallium nitride (InGaN)—aluminum gallium indium nitride (AlGaInN), indium gallium nitride (InGaN)—gallium nitride (GaN), aluminum gallium nitride (AlGaN)—gallium nitride (GaN), indium gallium nitride (InGaN)—aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor device comprising
a source region being electrically connected to a first load terminal of the semiconductor device;
a drift region comprising a first semiconductor material having a first band gap, the drift region having dopants of a first conductivity type and being configured to carry at least a part of a load current between the first load terminal and a second load terminal of the semiconductor device; and a semiconductor body region having dopants of a second conductivity type complementary to the first conductivity type and being electrically connected to the first load terminal, a transition between the semiconductor body region and the drift region forming a pn-junction, the pn-junction being configured to block a voltage applied between the first load terminal and the second load terminal, wherein the semiconductor body region isolates the source region from the drift region and includes a reduced band gap zone comprising a second semiconductor material having a second band gap that is smaller than the first band gap, wherein the reduced band gap zone and the source region exhibit, in a cross-section along a vertical direction, at least one of a common lateral extension range along a first lateral direction and a common vertical extension range along the vertical direction;

the first load terminal comprises a contact metal arranged in contact with each of the source region and the reduced band gap zone; and the semiconductor body region further comprises an anti latch-up zone, the anti latch-up zone being arranged in contact with the source region and the contact metal, and exhibiting a higher electric conductivity than the semiconductor body region external of the anti latch-up zone, wherein the anti latch-up zone and the reduced band gap zone exhibit a common overlap region.

2. A semiconductor device comprising a source region being electrically connected to a first load terminal of the semiconductor device;

a drift region comprising a first semiconductor material having a first band gap, the drift region having dopants of a first conductivity type and being configured to carry at least a part of a load current between the first load terminal and a second load terminal of the semiconductor device; and a semiconductor body region having dopants of a second conductivity type complementary to the first conductivity type and being electrically connected to the first load terminal, a transition between the semiconductor body region and the drift region forming a pn-junction, the pn-junction being configured to block a voltage applied between the first load terminal and the second load terminal, wherein the semiconductor body region isolates the source region from the drift region and includes a reduced band gap zone comprising a second semiconductor material having a second band gap that is smaller than the first band gap, wherein the reduced band gap zone and the source region exhibit, in a cross-section along a vertical direction, at least one of a common lateral extension range along a first lateral direction and a common vertical extension range along the vertical direction;

the semiconductor device further comprises a first gate trench and a second gate trench extending into the semiconductor body along the vertical direction, the semiconductor body region being arranged between the first gate trench and the second gate trench, wherein the reduced band gap zone extends for at least 20% of a horizontal distance between the first gate trench and the second gate trench along the first lateral direction.

3. The semiconductor device of claim 2, wherein the first load terminal comprises a contact metal arranged in contact with each of the source region and the reduced band gap zone.

4. The semiconductor device of claim 3, wherein the semiconductor body region further comprises an anti latch-up zone, the anti latch-up zone being arranged in contact with the source region and the contact metal, and exhibiting a higher electric conductivity than the semiconductor body region external of the anti latch-up zone, wherein the anti latch-up zone and the reduced band gap zone exhibit a common overlap region.

5. The semiconductor device of claim 1, further comprising an insulator and a gate electrode, the gate electrode being electrically insulated from the source region, the semiconductor body region and the drift region by the insulator, and being configured to induce an inversion channel inside a channel region of the semiconductor body region, the channel region extending along the insulator through the semiconductor body region from the source region to the drift region.

6. The semiconductor device of claim 5, wherein the reduced band gap zone extends into the channel region.

7. The semiconductor device of claim 6, wherein the overlap region extends into the channel region.

8. The semiconductor device of claim 1, further comprising at least one gate trench extending into the semiconductor body along the vertical direction, the gate trench being arranged in contact with each of the source region, the semiconductor body region and the drift region, and comprising the gate electrode and the insulator.

9. The semiconductor device of claim 8, wherein the semiconductor device comprises a first gate trench and a second gate trench, the semiconductor body region being arranged between the first gate trench and the second gate trench, wherein the reduced band gap zone extends for at least 20% of a horizontal distance between the first gate trench and the second gate trench along the first lateral direction.

10. The semiconductor device of claim 1, wherein the source region comprises the second semiconductor material.

11. A semiconductor device comprising a semiconductor body coupled to a first load terminal and a second load terminal of the semiconductor device, wherein the semiconductor body includes:

a first semiconductor layer comprising a first semiconductor material having a first band gap, the first semiconductor layer being configured to carry at least a part of a load current between the first load terminal and the second load terminal; and an emitter layer being in contact with the first semiconductor layer and being configured to inject charge carriers into the first semiconductor layer, wherein the emitter layer includes at least one first emitter zone comprising the first semiconductor material and at least one second emitter zone arranged laterally adjacent to the first emitter zone and comprising a second semiconductor material having a second band gap that is smaller than the first band gap;

wherein the semiconductor device further comprises a metal layer being electrically connected with one of the first load terminal and the second load terminal and arranged in contact with the emitter layer, a transition between the metal layer and the first emitter zone forming a first semiconductor-to-metal transition exhibiting a first contact resistance, and a transition between the metal layer and the second emitter zone forming a second semiconductor-to-metal transition exhibiting a second contact resistance that is smaller than the first contact resistance.

12. The semiconductor device of claim 11, wherein the first semiconductor-to-metal transition is configured to provide a Schottky contact between the metal layer and the first emitter zone, and wherein the second semiconductor-to-metal transition is configured to provide an ohmic contact between the metal layer and the second emitter zone.

13. The semiconductor device of claim 11, wherein the first semiconductor layer has dopants of a first conductivity type, and wherein each of the first emitter zone and the second emitter zone has dopants of a second conductivity type complementary to the first conductivity type.

14. The semiconductor device of claim 13, wherein the semiconductor device is a diode, and wherein the emitter layer forms an emitter region of the diode.

15. The semiconductor device of claim 13, wherein the semiconductor device is an IGBT, and wherein the emitter layer is electrically connected to the second load terminal, the second load terminal forming a collector terminal of the IGBT.

16. The semiconductor device of claim 11, wherein each of the first emitter zone, the second emitter zone, and the first semiconductor layer has dopants of the same conductivity type.

17. The semiconductor device of claim 16, wherein the semiconductor device is a diode, the first semiconductor layer forming at least a part of a drift region of the diode, and the emitter layer forming a cathode region of the diode, wherein the second emitter zone is arranged within an active region of the semiconductor body configured to carry the load current, and wherein the first emitter zone is arranged within an edge region of the semiconductor body, the edge region surrounding the active region.

18. The semiconductor device of claim 11, wherein the semiconductor device is a reverse conducting IGBT, the first semiconductor layer comprising a drift region having dopants of a first conductivity type, and the emitter layer being electrically connected to the second load terminal that forms a collector terminal, wherein the first emitter zone has dopants of a second conductivity type complementary to the first conductivity type, and wherein the second emitter zone has dopants of the first conductivity type.

19. The semiconductor device of claim 11, wherein a dopant concentration of the emitter layer is higher than a dopant concentration of the first semiconductor layer by a factor of at least 10.

20. The semiconductor device of claim 1, wherein the second band gap is smaller than the first band gap by at least 0.1 eV.

* * * * *